United States Patent
Poss

(10) Patent No.: US 6,445,221 B1
(45) Date of Patent: Sep. 3, 2002

(54) INPUT DRIVER FOR A DIFFERENTIAL FOLDER EMPLOYING A STATIC REFERENCE LADDER

(75) Inventor: Joe Martin Poss, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/523,425

(22) Filed: Mar. 10, 2000

(51) Int. Cl.[7] .................................................. H03B 1/00
(52) U.S. Cl. ..................... 327/108; 327/560; 327/531; 326/89; 330/258
(58) Field of Search ................................. 327/108, 307, 327/91, 93, 94, 96, 355, 356, 359, 560, 561, 531; 330/258; 341/122, 158; 326/82, 89

(56) References Cited

U.S. PATENT DOCUMENTS

| | | | |
|---|---|---|---|
| 4,228,366 A | * 10/1980 | Hiittemann et al. | 327/336 |
| 4,659,946 A | * 4/1987 | Agoston | 327/94 |
| 5,124,576 A | * 6/1992 | Jensen | 327/94 |
| 5,381,146 A | * 1/1995 | Kolte | 327/94 |
| 5,449,960 A | * 9/1995 | Ohi et al. | 327/94 |
| 5,467,035 A | * 11/1995 | Ohi et al. | 327/94 |
| 5,691,657 A | * 11/1997 | Hirano et al. | 327/94 |
| 5,736,952 A | 4/1998 | Kertis et al. | 341/159 |
| 5,874,934 A | * 2/1999 | Ito | 345/98 |

OTHER PUBLICATIONS

Nauta, B., and Venes, A. G. W. "A 70–MS/s 110–mW 8–b CMOS Folding and Interpolating A/D Converter," IEEE Journal of Solid–State Circuits, Dec. 1995; vol. 30, No. 12, pp. 1302–1308.

Venes, A. G. W., van de Plassche, R. J. "An 80–MHz, 80–mW, 8–b CMOS Folding A/D Converter with Distributed Track–and–Hold Preprocessing," IEEE Journal of Solid–State Circuits, Dec. 1996; vol. 31, No. 12, pp. 1846–1853.

* cited by examiner

Primary Examiner—Terry D. Cunningham
Assistant Examiner—Long Nguyen
(74) Attorney, Agent, or Firm—Bracewell & Patterson, LLP

(57) ABSTRACT

An input driver for use with a differential folder in a flash A/D converter having a static ladder that provides an array of reference voltages and a method of operation thereof. The input driver includes a differential signal driver, coupled to an AC input signal, that generates first and second complementary drive signals for a differential folder stage. A tracking circuit, coupled to the differential signal driver, is utilized to maintain a voltage at the center of the static ladder to improve common mode rejection of the input driver without reducing bandwidth. In a related embodiment, the voltage at the center of the static ladder is an average DC voltage of the first and second drive signals.

18 Claims, 9 Drawing Sheets

INPUT DRIVER FOR A DIFFERENTIAL FOLDER EMPLOYING A STATIC REFERENCE LADDER

BACKGROUND OF THE INVENTION

1. Technical Field of the Invention

The present invention relates generally to analog to digital (A/D) converters and in particular to folder circuits. Still more particularly, the present invention relates to an input driver for use with a differential folder having a static ladder and a method of operation thereof.

2. Description of the Related Art

There are various types of devices, typically called analog to digital converters (A/D), for converting an analog voltage to a digital signal representative of the analog voltage. One type of A/D converter is a "flash" converter wherein an analog signal is applied to multiple identical comparators, generally one for each possible quantization level. For example, for a device that generates a n-bit digital output word, there are $2^n$ possible quantization levels and one fewer comparator. An eight-bit A/D converter would typically have $2^8-1$, i.e., 255, comparators, each of which receives two inputs. The analog signal to be converted is applied to one input of each of the comparators and each comparator other input is tied to different, normally equally spaced, reference voltage. These reference voltages are typically derived from a reference static ladder, such as a resistance ladder. When a convert signal is applied to the comparators, each of the comparators that is tied to a reference voltage higher than the analog input signal generates a "1" output signal. The comparators that are tied to reference voltages lower in value than the analog input signal generate "0" output signals. The resultant outputs are sometimes referred to as a "thermometer code" of "1's" and "0's" arrayed on each side of a transition point that represents the analog input signal. The location of this transition point is then decoded to produce a digital output representation of the analog input signal at that point in time.

Folding is a type of analog preprocessing that is utilized to reduce the number of comparators in an A/D converter, such as the flash converter described above. A simplified block diagram of an exemplary folding A/D converter 100 is depicted in FIG. 1. Folding A/D converter 100 includes a preprocessing section 110 that so includes a plurality of folding circuits, or folders, that receive an analog input signal. The pre-processed analog signal is then provided to an interpolation section 120 prior to delivery to a comparator and logic section 130 that, in turn, generates a N-bit digital output signal. This method is employed to reduce the number of A/D comparators for a given N bit A/D. For example, a six-bit flash A/D would typically need sixty-three comparators. A folding type A/D with four folders, on the other hand, would only employ sixteen comparators for the least significant bit (LSB) information and three comparators for the most significant bit (MSB) information. For more information on how a Folding A/D circuit operates, see "A 70-MS/s 110-mW 8-b CMOS Folding and Interpolating A/D Converter" by Braum Nauta, et al, IEEE Journal of Solid-State Circuits, vol. 30, no. 12, December 1995, pp. 1302–1308, which is herein incorporated in its entirety by reference.

A schematic diagram of an embodiment of an exemplary single-ended folder circuit 200 is illustrated in FIG. 2. In practice, folder 200 would typically be one of N (where N>1) folder stages. In the depicted embodiment, transistors Q1–Q8 represent a typical folding stage with load resistors R0 and R1. The driving stage for folder 200 includes transistor Q9 that is coupled to an input AC signal Vin. A reference ladder comprising of resistors R6–R8 and coupled to a ladder reference signal Ladder_Reference provides voltage references V-N1, V_N2, V_N3 and V_N4 for the differential amplifier pairs in the folding stage. It should be noted that for simplicity, only one folding stage is shown. Those skilled in the art should readily appreciate that a practical implementation may include four or more folder stages utilizing a single static reference ladder and one folder driver. An exemplary graph illustrating the relationship between an output voltage Vout and the input voltage Vin for the single-ended folder 200 is depicted in FIG. 3A. The characteristic folding operation is shown as input voltage Vin increases. As input voltage Vin increases in value, the differential amplifier pair of transistors Q1 and Q2 switches a current J1 across load resistors R0 and R1. The continual increase of input voltage Vin will subsequently alternate currents J2, J3 and J4 across load resistors R0 and R1, resulting in output voltage Vout reversing polarity at each zero crossing.

Additional folding may be utilized to produce additional folding signals to drive into each A/D comparator. Ultimately each A/D comparator is driven by its own unique folded waveform whose zero crossing is typically shifted by one LSB. Thus a six-bit A/D with four folders would need sixteen folded signals. To obtain sixteen folded signals employing only four folder stages, an interpolation technique is utilized to generate four waveforms per one folder stage. FIG. 3B illustrates an exemplary graph of the signal outputs generated by four folder stages, generally designated F1, F2, F3 and F4, versus an input voltage Vin, i.e., a linear ramp in the illustrative embodiment. As shown in the illustrated graph, the zero crossings of each of the four folder outputs F1, F2, F3 and F4 are spaced by about 100 mV of input voltage Vin signal change.

One important parameter of folding A/Ds is the integrity of the zero crossings of the folder outputs. The A/D comparators discern between a logic "1" or "0" utilizing the folder output signals and the signals generated by the interpolation process. The exemplary graph depicted in FIG. 4A presents a closer look at interpolated signals, designated F2_A, F2_B and F2_C generated by folder outputs F2 and F3. It should be noted that these five signals, F2_A, F2_B, F2_C, F2 and F3 would typically be the input signals for the A/D comparators. The distance between the zero crossings, e.g., referenced as VLSB, determines the input voltage margin between each of the comparators referenced to input signal Vin. As shown in FIG. 4A, input signal Vin increases 25 mV from when interpolated signal F2_A crossed zero to when interpolated signal F2_B crossed zero. Since the folders generally have gain, i.e., Vout/Vin>1, the actual voltage margin as seen by the A/D comparator is VLSB_out=VLSB_in(Gain). For example, if the Gain is 2.8, the resultant VLSB_out=25 mV(2.8)=70 mV.

In the event that time-dependent noise disrupts input signal Vin relative to the static ladder reference voltages, the folder outputs F2 and F3 will also shift their respective zero crossings with respect to input signal Vin. To illustrate, with reference to FIG. 4B, a 25 mV shift of common mode noise will cause input signal Vin to also shift 25 mV. This, in turn, will also result in the interpolated zero crossing shifting to cause a 70 mV, one LSB error as seen by the comparators. This is a highly undesirable condition for an A/D converter needing to achieve one-half (½) LSB accuracy that has high speed interference on its input power supply.

Accordingly, what is needed in the art is an improved folding A/D converter that mitigates the above-described limitations.

SUMMARY OF THE INVENTION

It is therefore an object of the present invention to provide an improved differential folder for use in an analog to digital (A/D) converter.

It is another object of the present invention to provide an input driver for use with a differential folder having a static ladder and a method of operation thereof.

To achieve the foregoing objects, and in accordance with the invention as embodied and broadly described herein, an input driver for use with a differential folder having a static ladder that provides an array of reference voltages is disclosed. The input driver includes a differential signal driver, coupled to an AC input signal, that generates first and second complementary drive signals for a differential folder stage. A tracking circuit, coupled to the differential signal driver, is utilized to maintain a voltage at the center of the static ladder to improve common mode rejection of the input driver without reducing bandwidth. In a related embodiment, the voltage at the center of the static ladder is an average DC voltage of the first and second drive signals.

The present invention introduces a novel circuit that improves the analog preprocessing of an input analog signal before the A/D comparators sample the signal. Specifically, the present invention improves the common mode rejection of the input driver without sacrificing, or reducing, bandwidth. The present invention accomplishes this by forcing the center of the static reference ladder to be the same value as the DC average voltage of the differential driving signals. This, in turn, maintains the integrity of the folder output signals' zero crossings, i.e., no shifting, with minimal gain reduction.

In one embodiment of the present invention, the input driver further includes a common mode current generator. The current mode generator is utilized to provide current mode currents so that the common mode voltage at the output of the differential folder will not saturate the differential amplifier pairs employed in the folder stage.

In another embodiment of the present invention, the differential signal driver includes a positive phase and a negative phase emitter follower transistor pair, wherein each of the positive phase and negative phase emitter follower transistor pair having a collector coupled to a supply voltage and a base coupled to opposite phases of said input AC signal, respectively. In a related embodiment, the differential signal driver further includes first and second resistances coupled to emitter terminals of the positive and negative phase emitter follower transistor pair, respectively. The first and second resistances, in an advantageous embodiment, are a matched pair of resistors.

In yet another embodiment of the present invention, the tracking circuit utilizes an operational amplifier (op-amp) configured as a voltage follower. It should be readily apparent to those skilled in the art that other circuit devices and/or topologies may also be employed in place of the op-amp configured as a voltage follower. The present invention does not contemplate limiting its practice to any one particular circuit configuration.

The foregoing description has outlined, rather broadly, preferred and alternative features of the present invention so that those skilled in the art may better understand the detailed description of the invention that follows. Additional features of the invention will be described hereinafter that form the subject matter of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 5:
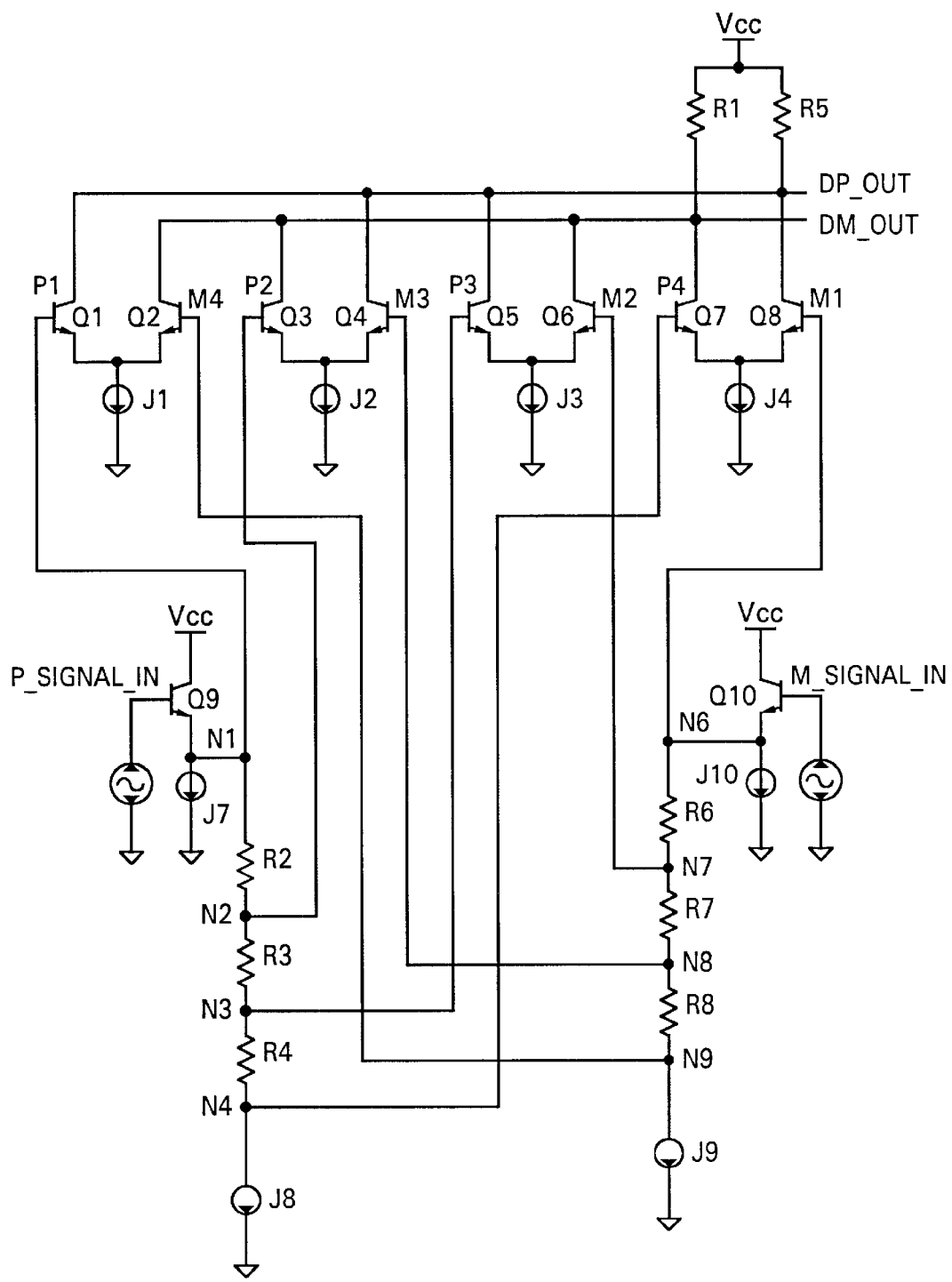
FIG. 5 illustrates a schematic diagram of an embodiment of a conventional folder utilizing a differential dynamic ladder.

Referring now to FIG. 5, there is depicted a schematic diagram of an embodiment of a conventional folder 500 utilizing a differential dynamic ladder. The differential dynamic ladder includes first and second sets of ladder references that follow the differential input signals P_SIGNAL_IN, M_SIGNAL_IN, respectively. The first set of ladder references includes resistances R2, R3 and R4 that generate reference voltages N1–N4 while the second set of ladder references generates reference voltages N6–N9 from resistances R6, R7 and R8. For a greater understanding of the operation of the differential dynamic ladder circuit, see "An 80-MHZ, 80-mW, 8-bit CMOS Folding A/D Converter with Distributed Track-and-Hold Preprocessing" by Rudy van de Plassche, et al, IEEE Journal of Solid-State Circuits, vol. 31, no. 12, December 1996, pp. 1846–1853, which is herein incorporated in its entirety be reference.

This circuit topology removes a majority of the unwanted input signal disruption, especially common mode input noise. This approach, however, increases the power requirements of folder since more power is required to drive the differential ladder. Other techniques have been proposed to drive the differential ladders for flash-type A/Ds to minimize the power required to achieve a given bandwidth, see, e.g., U.S. Pat. No. 5,736,952, issued to Kertis, et al, which is herein incorporated by reference. However, trade-offs must be considered when sizing the resistors in the ladder circuit for power, matching and bandwidth. For example, increasing the physical size of the resistors to realize better matching for the ladder reference voltages will require more power to drive and could ultimately limit the speed at which the folding A/D can achieve.

Figure 6:
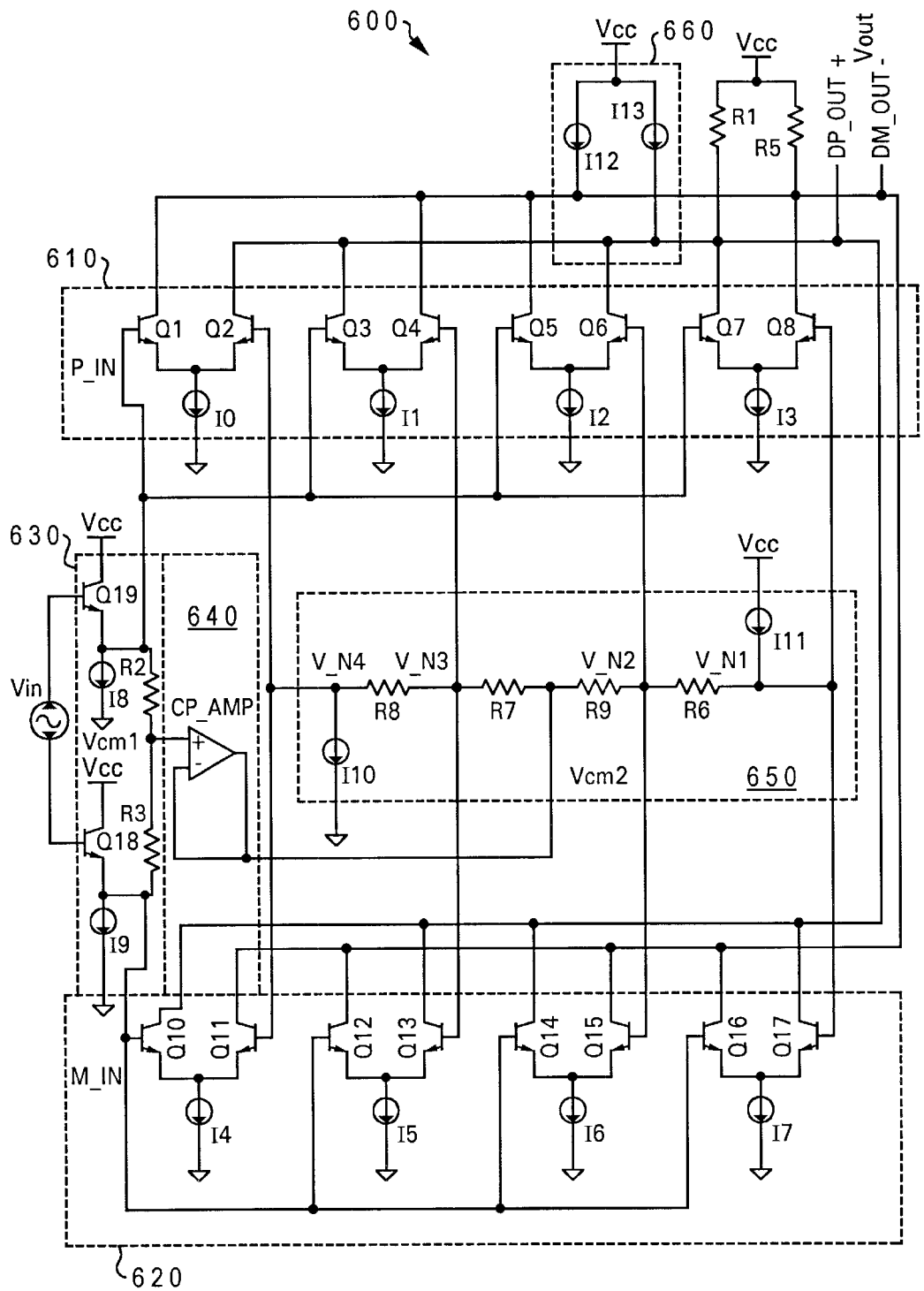
FIG. 6 illustrates a schematic diagram of an embodiment of a differential folder with a static ladder constructed according to the principles of the present invention.

Referring now to FIG. 6, there is illustrated a schematic diagram of an embodiment of a differential folder 600 with a static ladder 650 constructed according to the principles of the present invention. Differential folder 600 includes a single folding stage of a differential pair of first and second sets 610, 620 of differential amplifier pairs. First set 610, in a preferred embodiment, includes first through eight transistors Q1–Q8 that make up four differential amplifier pairs. It should be readily apparent to those skilled in the art that the number of differential pairs is not limited to four but, in other advantageous embodiments, may vary depending on the specific application of folder 600. Second set 620 is the differential component to first set 610 and provides the same function as first set 610. Second set 620 also includes four pairs of differential amplifiers, i.e., tenth through seventeenth transistors Q10–Q17. Folder 600 also includes first and second load resistors R0, R1 that are tied respectively to different transistor collectors in each differential amplifier pair. The collector terminals of transistors Q1, Q4, Q5, Q8, Q11, Q12, Q15 and Q16 are coupled together at first load resistor R0 to generate an output signal P_OUT. Similarly, the collector terminals of transistors Q2, Q3, Q6, Q7, Q10, Q13, Q14 and Q17 are dotted at second load resistor R1 to generate an output signal M_OUT. The resultant signal output Vout of folder 600 is Vout=(P_OUT−M_OUT).

A static ladder 650 is also provided in folder 600 to generate first, second, third and fourth reference signal (voltages) V_N1, V_N2, V_N3, V_N4 for the differential amplifier pairs in first and second sets 610, 620. Static ladder 650 generates these reference voltages utilizing sixth through ninth resistors R6–R9 that are coupled to a supply voltage Vcc and ground through current sources I10 and I11, respectively. It should be noted that the number of reference signals and, therefore, the number of resistors employed will vary depending on the number of differential amplifier pairs utilized.

Folder 600 utilizes an input driver that includes a differential signal driver 630 and a tracking circuit 640 to provide first and second complementary, i.e., opposite phases, signals to first and second sets 610, 620. Differential signal driver 630 is coupled to an input signal Vin and includes a positive phase and negative phase emitter follower pair of nineteen and eighteen transistors Q19, Q18, respectively. Each of eighteen and nineteen transistors Q18, Q19 has a collector coupled to supply voltage Vcc and a base coupled to opposite phases of input signal Vin. In the illustrated embodiment, transistor Q19 drives one side of the folder differential pair, i.e., first set 610, with the positive signal at node P_IN while transistor Q18 drives the complementary folder pair, i.e., second set 620, with the negative signal at node M_IN. Differential signal driver 630 also includes second and third resistors R2, R3 that are coupled to emitter terminals of nineteen and eighteen transistors Q19, Q18, respectively. Second and third resistors R2, R3 are coupled together at a node to provide an input signal, designated Vcm1, to tracking circuit 640. Second and third resistors R2, R3, in a preferred embodiment, are a matched pair of resistors, and a signal Vcm1 is derived from input signal Vin as the average voltage at the emitters of eighteen and nineteen transistors Q18, Q19. Tracking circuit 640, in an advantageous embodiment, utilizes an operational amplifier OP_AMP configured as a voltage follower to maintain a voltage, designated Vcm2, at the center of static ladder 650.

Figure 7A:
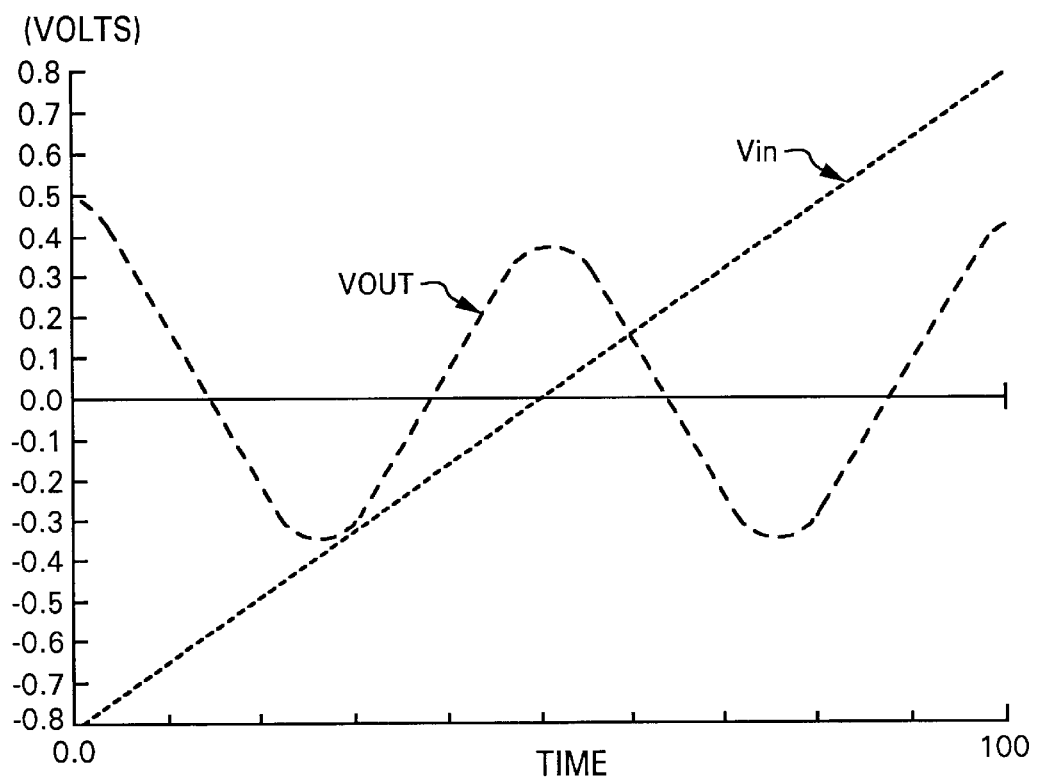
FIG. 7A illustrates the response of the folder depicted in FIG. 6 output signal to a linear ramp input signal.

Folder 600 further includes a common mode current generator 660 that utilizes current sources I12, I13 that, in an advantageous embodiment, are PFET devices configured as current sources. Common mode current generator 660 is utilized to provide current mode currents so that the common mode voltage at output Vout will not saturate the differential amplifier pairs. Although not shown, there may be a cascade stage between first and second load resistors R0, R1 and the collectors of the of the differential amplifier pairs to increase bandwidth. In an advantageous embodiment, the cascade stage may be a simple FET device tied to supply voltage Vcc to separate out the high capacitance introduced at output voltage Vout by current sources I12, I13. FIG. 7A depicts the response of folder 600 output signal Vout to a linear ramp input signal Vin. As illustrated in FIG. 7A, output signal Vout has similar zero crossings with respect to input signal Vin as with the previously discussed folder circuits.

Signal Vcm1, as mentioned previously, is derived from input signal Vin, as the average voltage at the emitter terminals of transistors Q18 and Q19. Specifically, if signal P_IN represents the emitter voltage of transistor Q18 and signal M_IN represents the emitter voltage of transistor Q19, then signal Vcm1=½(P_IN+M_IN). Since signals P_IN and M_IN are derived from input signal Vin, signals P_IN and M_IN are a differential signal pair and Vcm1 will be the DC average voltage of these AC signals. Additionally, since tracking circuit 640 keeps signal Vcm2 equal to signal Vcm1, the voltage at the center of static ladder 650 is also the DC average of signals P_IN and M_IN.

Reference voltages V_N1–V_N4 are developed from sixth through ninth resistors R6–R9 and current sources I10 and I11 with signal Vcm2 forcing the center of static ladder 650. Specifically, reference voltages V_N1=Vcm2+I11(R6+R9); V_N2=Vcm2+I11(R9); V_N3=Vcm2−I10(R7) and V_N4=Vcm2−I10(R7+R8). Reference voltages V_N1–V_N4 are DC voltages that are utilized to determine the switch points for each differential amplifier pair in first and second sets 610, 620.

In the ideal situation, at certain input signal Vin levels, two differential amplifier pair will switch together changing output signal Vout. For example, assuming input signal Vin is 200 mV differentially, Vcm2−V_N4=100 mV and Vcm2+V_N1=100 mv, then differential pairs of transistors Q1/Q2 and Q16/Q17 will switch at the same voltage level. Having the differential amplifier pairs switch at complementary signals P_IN and M_IN levels will maximize the gain Q of the circuit where is voltage output Vout=G(Vin). Ideally, the op-amp in tracking circuit 640 will keep Vcm2=Vcm1. However, it should be noted that the inherent inaccuracies of the opamp and the resistor matching of second and third resistors R2, R3 will introduce an offset voltage. Additionally, mismatching in the reference voltage signals V_N1–V_N4 as well as bias currents from the bases of the bipolar devices employed will also introduce errors. It should be noted that these mismatches can be reduced to reasonable levels.

Equation 1 below describes the relationship between input and output signals Vin, Vout and Vcm, where Vcm=½(P_IN+M_IN)−Vcm2. Therefore, any mismatch errors from the above discussed factors will be combined as one mismatch voltage Vcm.

$$Vout = Ibias(Rload)[\tan h((0.5Vin+Vcm)/(2Vt)) - \tan h((-0.5Vin+Vcm)/(2Vt))] \qquad \text{Equation 1:}$$

where Ibias is the current in one differential amplifier pair, Rload=(R1+R0) and Vt is the thermal voltage for a bipolar transistor.

Figure 1:
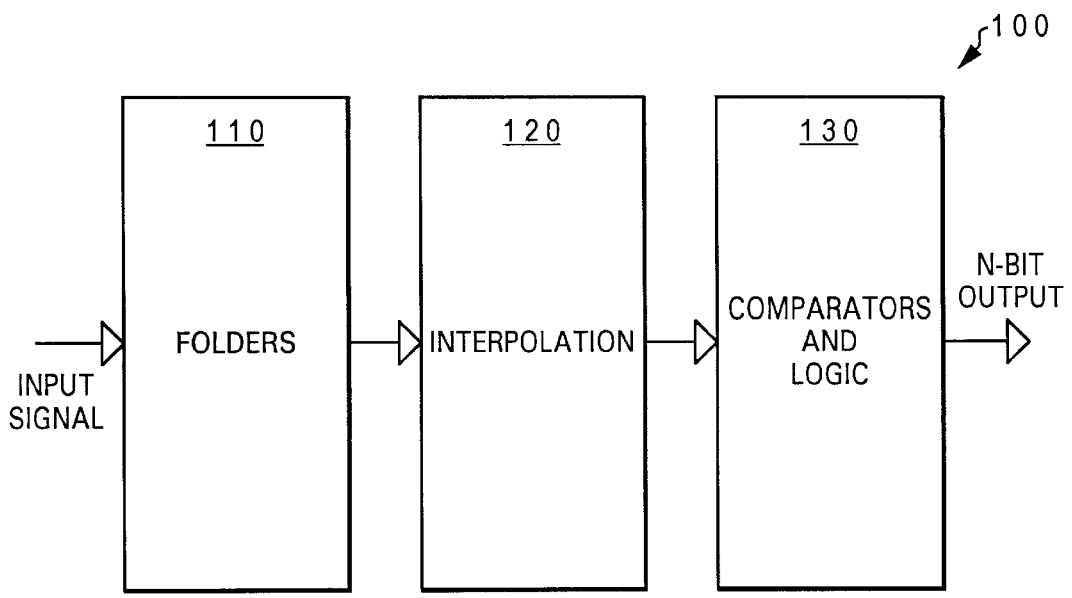
FIG. 1 illustrates a simplified block diagram of an exemplary conventional folding A/D converter.
Figure 2:
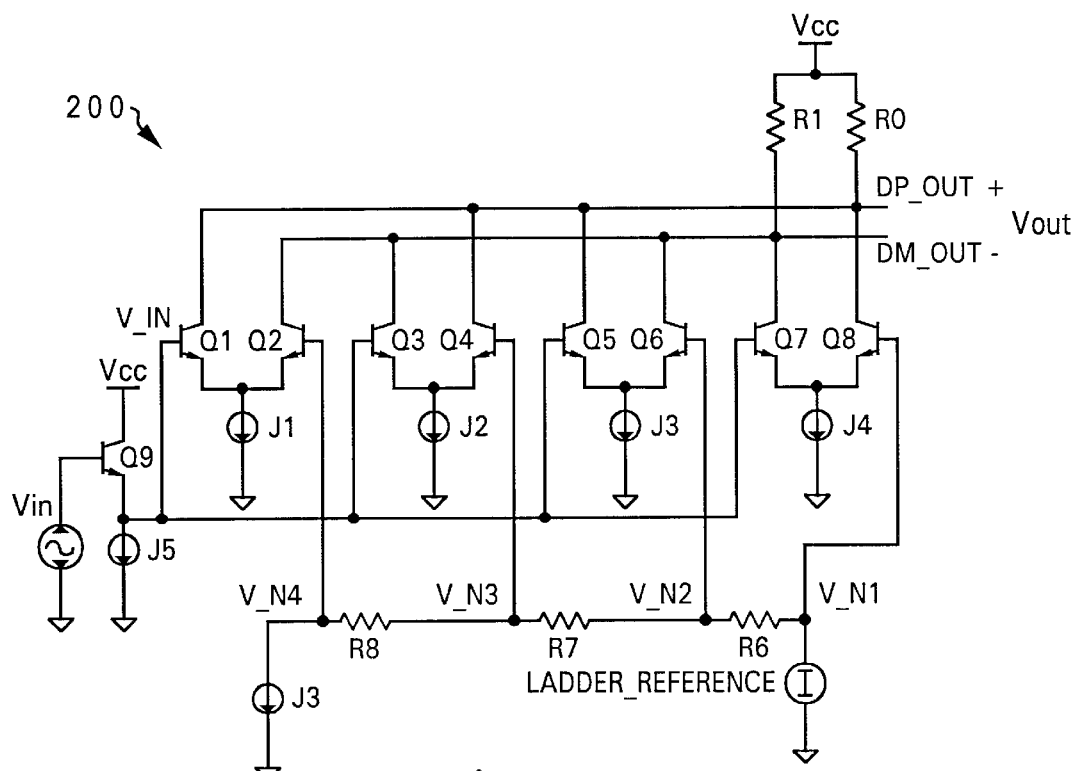
FIG. 2 illustrates a schematic diagram of an embodiment of an exemplary single-ended folder circuit.
Figure 3A:
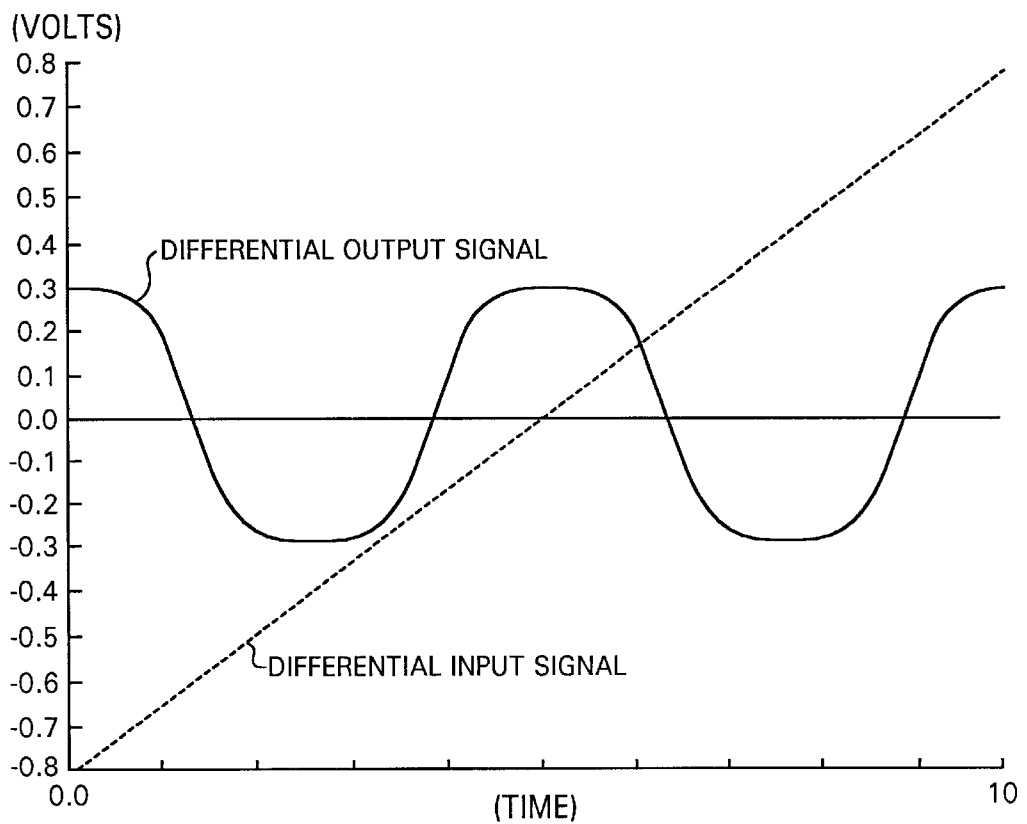
FIG. 3A illustrates the relationship between the output voltage and input voltage of the single-ended folder depicted in FIG. 2.
Figure 3B:
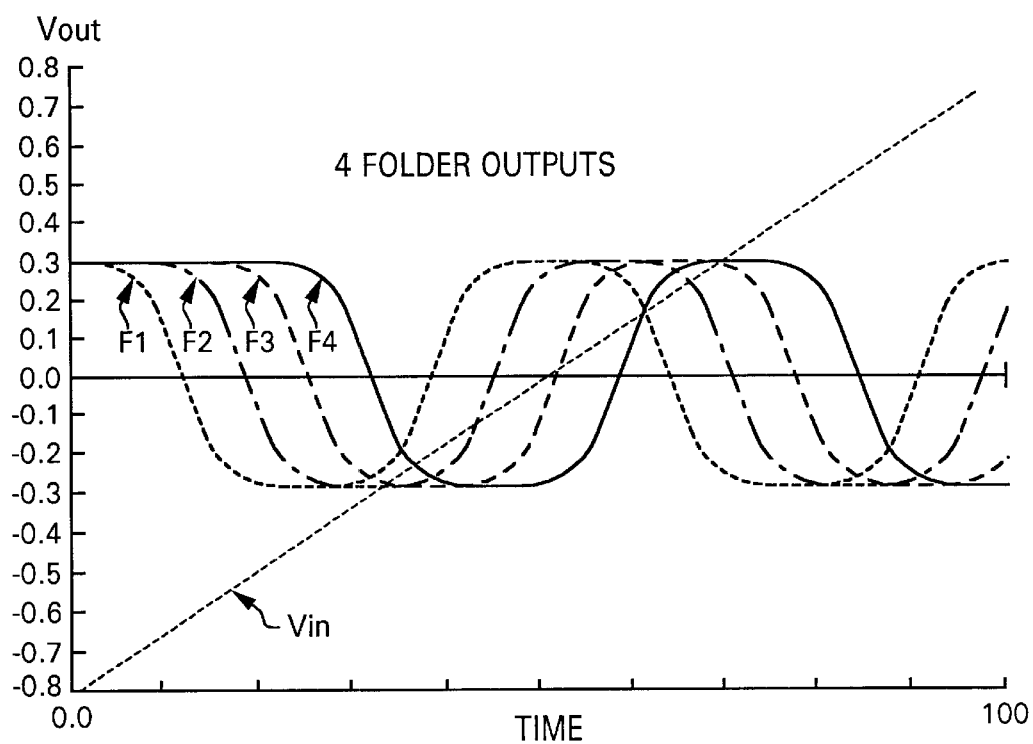
FIG. 3B illustrates an exemplary graph of the signal outputs generated by four folder stages versus an input voltage.
Figure 4A:
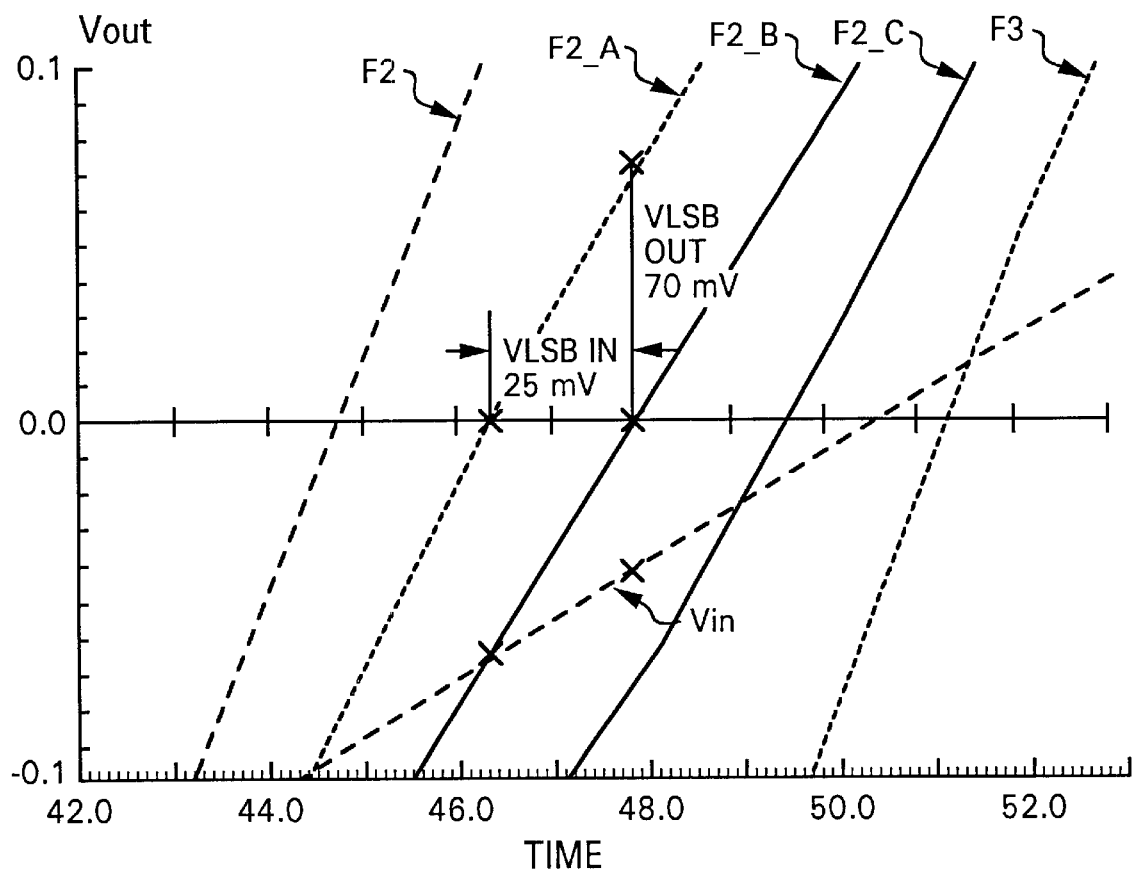
FIG. 4A illustrates interpolated signals generated by two folder outputs.
Figure 4B:
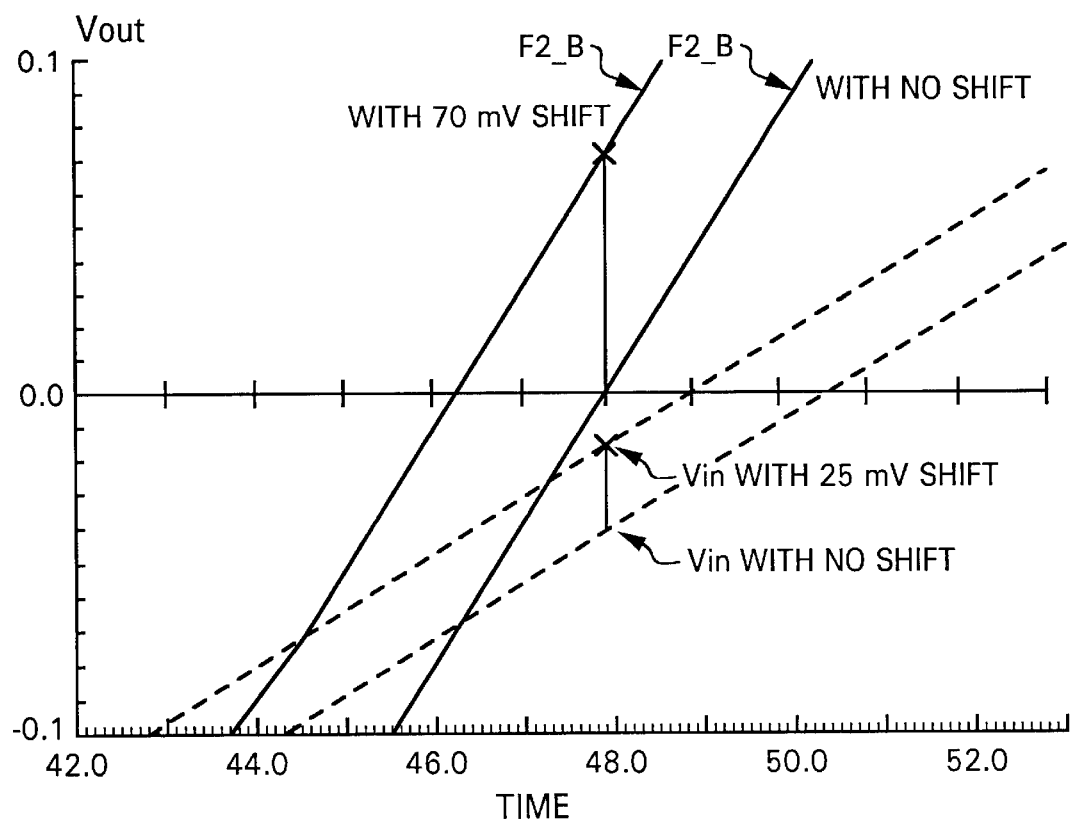
FIG. 4B illustrates a common mode shift for a single-ended folder.
Figure 7B:
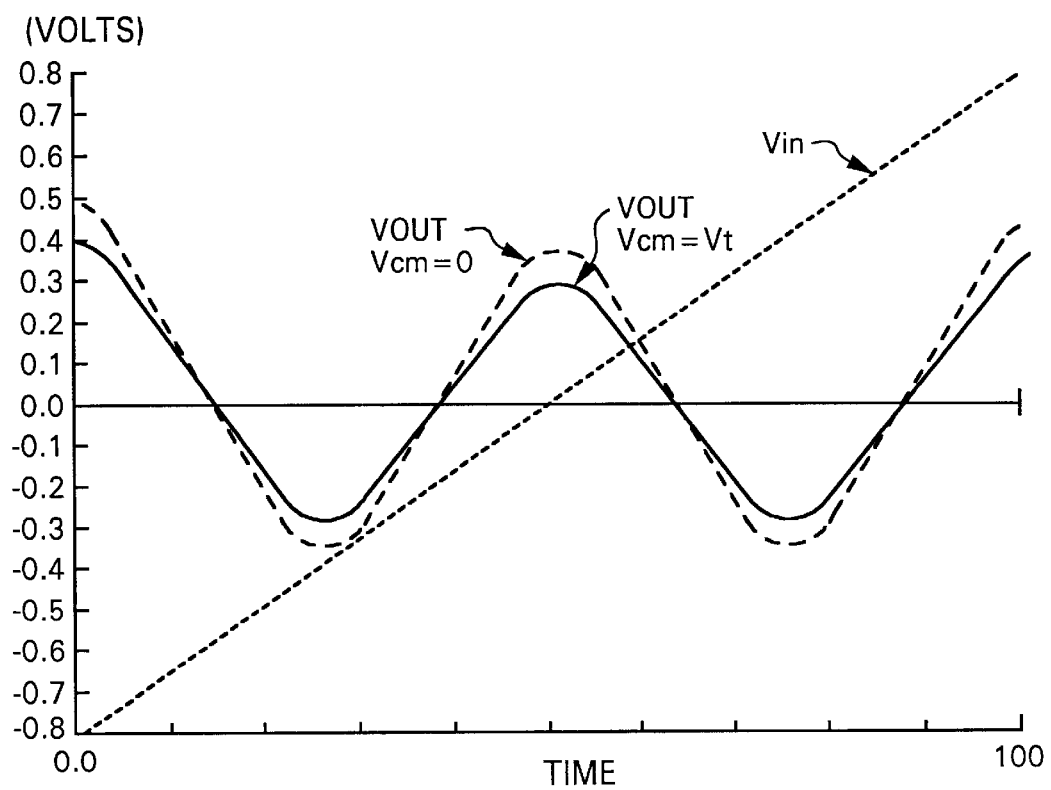
FIG. 7B illustrates graphically the output voltage of the folder depicted in FIG. 6 versus an input signal with Vcm=Vt and Vcm=0.

Equation 1 above quantitatively illustrates that if Vcm is a non-zero value, output voltage Vout will still change polarity at the same input signal Vin level as if Vcm=0. It should be re-emphasized that the zero crossing of output voltage Vout will not change when Vcm is a non-zero value which is one of the advantages of the present invention. With Vin=Vt and Vcm=0, then Vout/(IbiasxRload)=0.49. On the other hand, with Vin=Vt and Vcm=Vt, then Vout/(IbiasxRload)=0.39. This illustrates that there will only be a 20% drop in output signal Vout if Vcm=Vt. This is in sharp contrast to the single-ended folder depicted in FIG. 2 where if Vcm=Vt, the zero crossings are significantly shifted (see FIG. 4B). In the case of differential folder 600, the zero crossing does not change relative to input signal Vin and only a 20% gain reduction is suffered with Vcm=Vt. This is shown in FIG. 7B that graphically illustrates folder 600 output voltage Vout versus input signal Vin with Vcm=Vt and Vcm=0.

The present invention may be embodied in other specific forms without departing from its spirit or essential characteristics. The described embodiments are to be considered in all respects as illustrative and not restrictive. The scope of the invention is, therefore, indicated by the appended claims rather than by the foregoing description. All changes which come within the meaning and range of equivalency of the claims are to be embraced within their scope.

What is claimed is:

1. A circuit having an input driver and a static ladder that provides an array of reference voltages for use in a differential folder, wherein the input driver comprising:
    a differential signal driver, coupled to an AC input signal, that generates first and second complementary drive signals; and
    a tracking circuit, coupled to said differential signal driver and said static ladder, that maintains a voltage at a center of said static ladder to improve common mode rejection of said input driver without reducing bandwidth.

2. The circuit as recited in claim 1 further comprising a common mode current generator coupled to an output of said differential folder.

3. The circuit as recited in claim 1 wherein said differential signal driver includes a positive phase and a negative phase emitter follower transistor pair, wherein each of said positive phase and negative phase emitter follower transistor pair having a collector coupled to a supply voltage and a base coupled to opposite phases of said input AC signal, respectively.

4. The circuit as recited in claim 3 wherein said differential signal driver further comprises first and second resistances coupled to emitter terminals of said positive and negative phase emitter follower transistor pair, respectively.

5. The circuit as recited in claim 4 wherein said first and second resistances are a matched pair of resistors.

6. The circuit as recited in claim 1 wherein said tracking circuit comprises an operational amplifier (op-amp) configured as a voltage follower.

7. A method for improving common mode rejection without reducing bandwidth of a differential folder having a static ladder, comprising the steps of:
    generating first and second complementary drive signals utilizing a differential signal driver, wherein said differential signal driver is coupled to an AC input signal; and
    maintaining a voltage at a center of said static ladder that provides an array of reference, voltages utilizing a tracking circuit, wherein said voltage is an average DC voltage of said first and second complementary drive signals.

8. The method as recited in claim 7 further comprising the step of generating common mode currents utilizing a common mode current generator.

9. The method as recited in claim 7 wherein said tracking circuit comprises an operational amplifier (op-amp) configured as a voltage follower.

10. The method as recited in claim 7 wherein said differential signal driver includes a positive phase and a negative phase emitter follower transistor pair, wherein each of said positive phase and negative phase emitter follower transistor pair having a collector coupled to a supply voltage and a base coupled to opposite phases of said AC input signal, respectively.

11. The method as recited in claim 10 wherein said differential signal driver further comprises first and second resistances coupled to emitter terminals of said positive and negative phase emitter follower transistor pair, respectively.

12. The method as recited in claim 11 wherein said first and second resistances are a matched pair of resistors.

13. A differential folder, comprising:
    at least one folding stage, said folding stage including a differential pair of first and second sets of differential amplifier pairs;
    a static ladder, coupled to a supply voltage, that generates an array of reference signals to said first and second sets of differential amplifier pairs; and
    an input driver, coupled to an AC input signal, including:
        a differential signal driver that generates first and second drive signals for said first and second sets of differential amplifier pairs, respectively; and
        a tracking circuit, coupled to said differential signal driver and said static ladder, that maintains a voltage at a center of said static ladder to improve common mode rejection of said input driver without reducing bandwidth.

14. The differential folder as recited in claim 13 further comprising a common mode current generator coupled to said first and second sets of differential amplifier pairs.

15. The differential folder as recited in claim 13 wherein said differential signal driver includes a positive phase and a negative phase emitter follower transistor pair, wherein each of said positive phase and negative phase emitter follower transistor pair having a collector coupled to a supply voltage and a base coupled to opposite phases of said input AC signal, respectively.

16. The differential folder as recited in claim 15 wherein said differential signal driver further comprises first and second resistances coupled to emitter terminals of said positive and negative phase emitter follower transistor pair, respectively.

17. The differential folder as recited in claim 16 wherein said first and second resistances are a matched pair of resistors.

18. The input driver as recited in claim 13 wherein said tracking circuit comprises an operational amplifier (op-amp) configured as a voltage follower.

\* \* \* \* \*